United States Patent

Verdi et al.

[11] Patent Number: 6,125,042
[45] Date of Patent: Sep. 26, 2000

[54] BALL GRID ARRAY SEMICONDUCTOR PACKAGE HAVING IMPROVED EMI CHARACTERISTICS

[75] Inventors: Fred W. Verdi, Lawrenceville; Richard Haynes, Princeton, both of N.J.

[73] Assignee: Lucent Technologies, Inc., Murray Hill, N.J.

[21] Appl. No.: 09/058,505

[22] Filed: Apr. 10, 1998

[51] Int. Cl.$^7$ ...................................................... H05K 7/02
[52] U.S. Cl. .......................... 361/760; 361/751; 361/764; 361/767; 257/779; 257/780; 257/781; 257/782; 257/737; 257/738
[58] Field of Search ...................................... 361/760, 751, 361/764, 767; 257/779, 780, 781, 782, 786, 737, 738, 698, 684, 691, 693

[56] References Cited

U.S. PATENT DOCUMENTS

| | | | |
|---|---|---|---|
| 5,334,857 | 8/1994 | Mennitt et al. | 257/48 |
| 5,355,283 | 10/1994 | Marrs et al. | 361/760 |
| 5,400,220 | 3/1995 | Swamy | 361/760 |
| 5,424,492 | 6/1995 | Petty et al. | 174/250 |
| 5,442,852 | 8/1995 | Danner | 29/843 |
| 5,444,296 | 8/1995 | Kaul et al. | 257/686 |
| 5,521,435 | 5/1996 | Mizukoshi | 257/698 |
| 5,541,450 | 7/1996 | Jones et al. | 257/697 |
| 5,561,323 | 10/1996 | Andros et al. | 257/707 |
| 5,717,245 | 2/1998 | Pedder | 257/691 |
| 5,796,170 | 8/1998 | Marcantonio | 257/786 |

OTHER PUBLICATIONS

Freyman et al., Overmolded Plastic Pad Array Carriers (OMPAC): A Low Cost, High Interconnect Density IC Packaging Solution For Consumer and Industrial Electronics, pp. 176–179, 181–182.

*Primary Examiner*—Leo P. Picard
*Assistant Examiner*—David Foster

[57] ABSTRACT

The present invention is directed to an integrated circuit package having improved EMI characteristics. In accordance with one aspect of the invention, a ball grid array integrated circuit package is provided for attachment to a circuit board. The circuit package includes a substrate having a semiconductor die defining an electronic circuit formed thereon. A matrix of spherically-shaped package leads is disposed adjacent the substrate and opposite the semiconductor die. Conductive elements, such as bond wires, electrically connect circuit points on the semiconductor die to the package leads. Further, at least one conductive element electrically interconnects each of the leads that define a perimeter of the matrix of package leads, for electrical connection to ground. In the preferred embodiment, adjacent leads of the perimeter matrix are separated by a spacing that is no greater than 1/20 of the wavelength of the highest frequency electrical signal carried on any of the signal leads. In accordance with another aspect of the invention, a printed circuit board assembly comprises a circuit board substrate having conductive elements and a socket area for receiving a semiconductor package, wherein the socket area is defined by a matrix of conductive pads. Each conductive pad includes a metal coating and is shaped to receive a lead of the semiconductor package. Finally, at least one conductive element or trace electrically connects each of the conductive pads that define a perimeter of the matrix of conductive pads, for electrical connection to ground.

21 Claims, 5 Drawing Sheets

BALL GRID ARRAY SEMICONDUCTOR PACKAGE HAVING IMPROVED EMI CHARACTERISTICS

BACKGROUND OF THE INVENTION

1. Field of the Invention

The present invention generally relates to semiconductor devices, and more particularly to a ball grid array (BGA) semiconductor device having improved electromagnetic interference (EMI) characteristics.

2. Discussion of the Related Art

A variety of packaging styles are known for semiconductor devices. Dual in-line packages (DIPs), pin grid arrays (PGAs), and surface mount packages are examples of several semiconductor package styles. These package styles, however, become problematic at higher operating frequencies.

More specifically, at high frequencies even the relatively short leads of standard surface mount, or through hole mount, integrated circuit (IC) packages tend to act like antennas, radiating electromagnetic fields outwardly therefrom. Even home computers today operate at clock speeds of 300 Mhz or higher. Other, specialized computing devices operate at even higher speeds. The high frequency signals input to and output from an IC pass across the chip leads. Longer package leads results in a more severe "antenna" effect and thus more intense EMI.

As is known, EMI is disruptive to the proper operation of other circuit components proximately located to the source of the EMI. Accordingly, there is an identifiable need to reduce the levels of EMI generated. As is further known, this may be achieved by reducing the lead length of integrated circuit components. Ball grid array (BGA) packages are a known package style that have a lessened radiation of EMI because of much shorter lead length.

BGA packages connect to a PC Board through an array of solder balls beneath the packages. The area array reduces package size and increases lead pitch, leading to higher assembly yields. More particularly, a BGA is a type of packaged integrated circuit in which one or more integrated circuit chips are mounted on a surface of a substrate, and electrical connection to electrically conductive material not part of the packaged integrated circuit, such as a printed circuit board, is made by an array of solder balls located on a surface of the substrate opposite the surface to which the integrated circuit chip or chips are attached. The integrated circuit chip or chips and the passive components are typically encapsulated by, for instance, plastic to protect the integrated circuit chip or chips and the passive components from the external environment. The integrated circuit chip is electrically connected to the substrate by wirebonding, tape-automated bonding, or flip-chip interconnection. BGAs allow a high density of external chip connections to be made as compared to other packaged integrated circuits having leads extending from the package.

Flip chip interconnect technology supports "area array interconnect," in which the die is mechanically and electrically connected through an array of solder bumps on the active face of the circuit. This technique increases the number of connections that can be made for a given die size and can also improve electrical performance. The die is attached to the substrate face down and is typically reinforced with an epoxy underfill.

From a manufacturing point of view, BGA packages have many virtues. A BGA package can pack the same processing power as a QFP package into 40 percent less volume, making BGA chips thinner and lighter. BGA also offer designers flexibility, allowing them to maximize the density of connections per chip to improve high-frequency operation.

Even with the shorter lead length of BGA packages, however, the high frequency operation of many modern electronic devices may still generate unacceptable levels of EMI. Accordingly, it is desired to provide an improved semiconductor package that results in lower levels of EMI.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to an integrated circuit package having improved EMI characteristics. In accordance with one aspect of the invention, a ball grid array integrated circuit package is provided for attachment to a circuit board. The circuit package includes a substrate having a semiconductor die defining an electronic circuit formed thereon. A matrix of spherically-shaped package leads is disposed adjacent the substrate and opposite the semiconductor die, for "face-up" BGA packages. For "face-down" BGA packages, the leads are disposed on the same side as the die, but on a lower plane. Conductive elements, such as bond wires, electrically connect circuit points on the semiconductor die to the package leads. Further, at least one conductive element electrically interconnects each of the leads that define a perimeter of the matrix of package leads, for electrical connection to ground. In the preferred embodiment, adjacent leads of the perimeter matrix are separated by a spacing that is no greater than $\frac{1}{20}$ of the wavelength of the highest frequency electrical signal carried on any of the signal leads. Furthermore, the preferred embodiment of the invention includes a BGA package having a "face-down" configuration, having a metal plane on the top of the package. This metal plane cooperates with the perimeter leads to form a more effective Faraday Cage, in accordance with the concepts and teachings discussed herein.

In accordance with another aspect of the invention, a printed circuit board assembly comprises a circuit board substrate having conductive elements and a socket area for receiving a semiconductor package, wherein the socket area is defined by a matrix of conductive pads. Each conductive pad includes a metal coating and is shaped to receive a lead of the semiconductor package. Finally, at least one conductive element or trace electrically connects each of the conductive pads that define a perimeter of the matrix of conductive pads, for electrical connection to ground.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
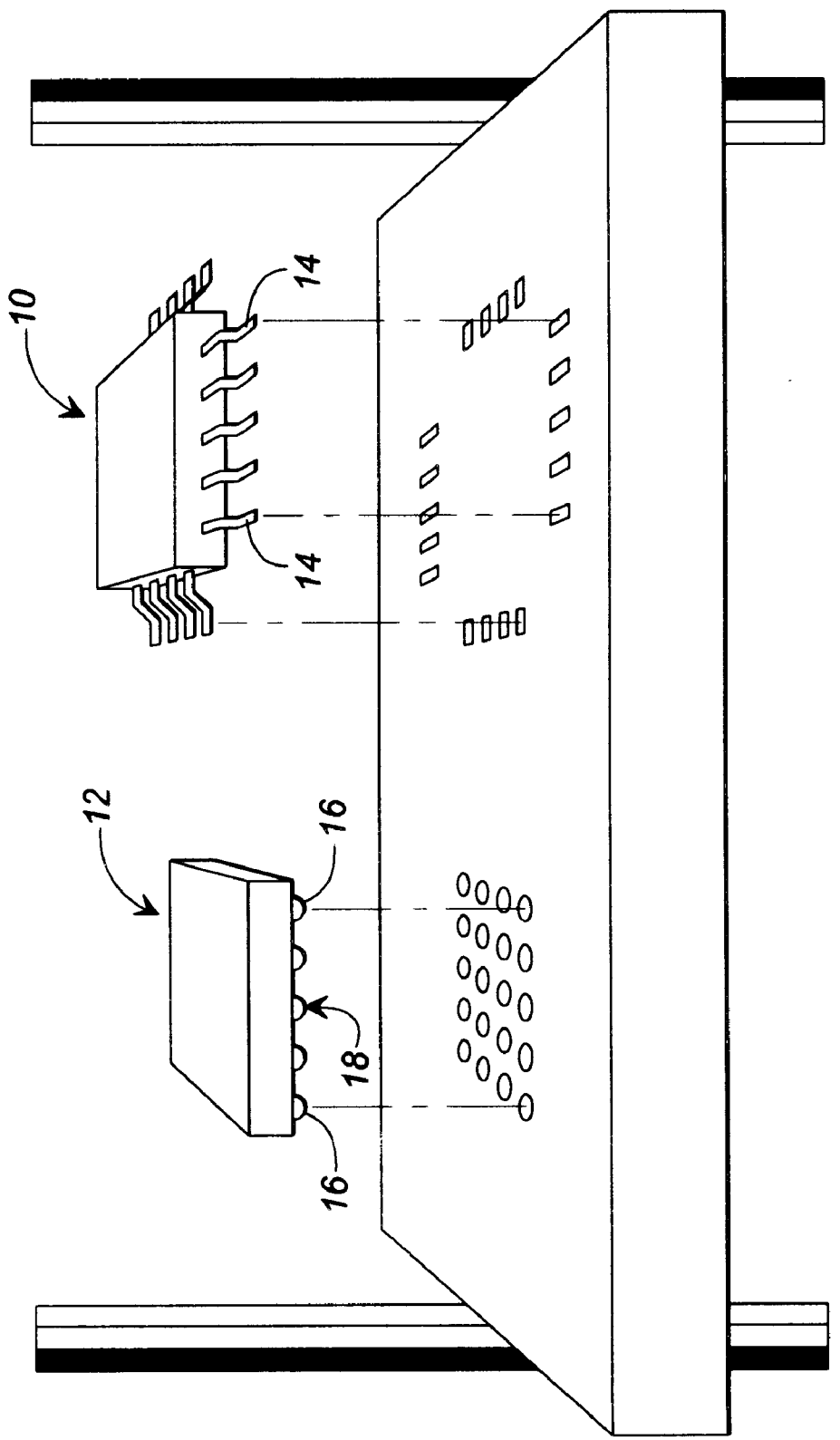
FIG. 1 is perspective view illustrating a ball grid array and a quad flat pack integrated circuit packages side by side to contrast the footprint formed by the leads.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Packaging is an art based on the science of establishing interconnections ranging from zero-level packages (chip-evel connections), first-level packages (either single-chip or multichip modules), second-level packages (e.g., Printed Circuit Boards (PCBs)), and third-level packages (e.g., mother boards). Because of the recent trend in wire bonding, tape automated bonding, and flip bare Chips On printed circuit Board (COB) technology, the distinction between the first and second levels of packages is blurred. Ofter, COB is called the one-and-one-half (or 1.5) level package. The most common methods of chip level interconnects are wire bonding, Tape Automated Bonding (TAB), and solder bumping. Among these three technologies, solder bumped flip chip provides the highest packaging density with less packaging delay.

There are many forms of first-level packages. Some examples are: thin Tape Carrier Package (TCP), Plastic Quad Flat Pack (PQFP), Thin Plastic Quad Flat Pack (TQFP), Square Quad Flat Pack (SQFP), Rectangular Quad Flat Pack (RQFP), Very Small Outline Package (VSOP), Very Small Quad Flat Pack (VSQF), Small Outline Integrated Circuit (SOIC), Thin Small Outline Package (TSOP), Plastic Leaded Chip Carrier (PLCC), SOIC with J-Leads (SOJ), Dual In-line Package (DIP), Ceramic Quad Flat Pack (CQFP), Leadless ceramics Chip Carrier (LCCC),ceramic Pin Grid Any (PGA), Plastic Pin Grid Arry (PPGA), Surface mount Pin Grid Arry (SPGA), Plastic Ball Grid Array (PBGA), Ceramic Ball Grid Arrary (CBGA), Area Tape Automated Bonding Ball Grid Array (TBGA). The trends in single-chip (or multichips with standard single chip) carriers are finer pitch, higher pin count, larger horizontal body size, thinner vertical body size, and area array.

Turning now to the drawings, FIG. 1 illustrates a comparative difference between a QFP 10 and a BGA 12 package design/layout. As PCBs become more crowded and through-put requirements become more demanding, the quad-flat-package (QFP) design used by many PCBs is approaching its technical limitations. QFP technology relies on tiny, fragile "gullwing " leads 14 which extend outward from the edges of chips. These leads 14 are extremely vulnerable to damage during shipment and manufacturing, as well as during subsequent desktop maintenance operations. In addition, QFP packaging has run up against physical and practical barriers involving the spacing and length of leads that can be attached to substrates using existing surface-mount technology.

BGA packaging solves many of these problems. BGA chips expose their electrical connection points in an array of tiny hemispheres 16, arranged in a matrix 18 on the chip's mounting surface. This design offers manufacturers lower cost, reduced size, high connection density, and a sturdy form factor that is well-adapted to high-volume production of chips. As illustrated in FIG. 1, for two integrated circuit packages of the same size (excluding leads), the footprint of the BGA package 12 is significantly smaller than the QFP package 10. Therefore, in a given area on a PCB, a higher density of BGA packages may be arranged, thus providing a higher circuit density.

Figure 2:
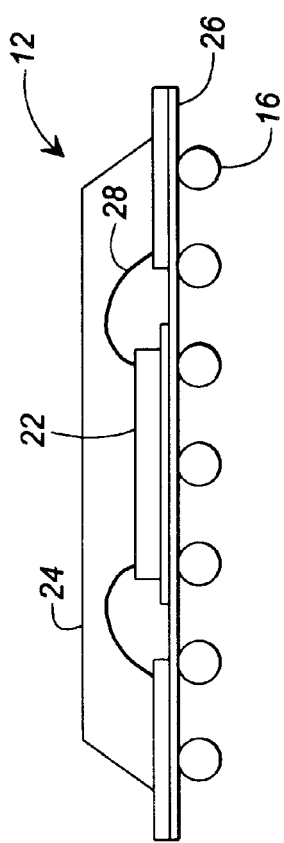
FIG. 2 is a cross-sectional side view of a first ball grid array integrated circuit package constructed in accordance with the present invention.

Turning now to FIG. 2, a cross sectional-side view of a BGA package is shown The package 12 includes a die 22 (e.g., silicon) sealed by for example, an epoxy over mold 24. Preferably, the epoxy over mold 24 hermetically seals the die 22 against a substrate, such as a glass PCB 26. Gold bond wires 28 couple the circuitry of the silicon die 22 to the chip leads 16, and ultimately to a larger printed circuit board.

Figure 3:
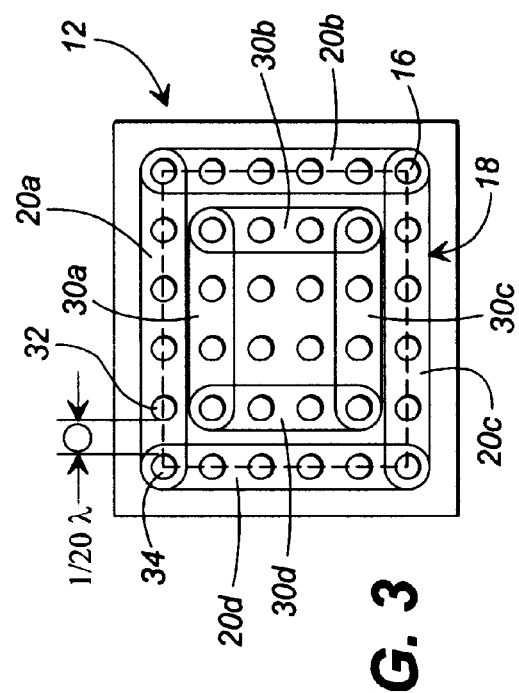
FIG. 3 is a bottom view of a ball grid array package constructed in accordance with the present invention.

Reference is now made to FIG. 3, which shows a bottom view of a BGA package 12, particularly illustrating the matrix 18 of hemisphericaly-shaped solder leads 16. As is known, the solder leads 16 may be comprised of a variety of conductive materials. For simplicity, FIG. 3 illustrates a six by six matrix 18 of leads 16.

In the preferred embodiment of the invention, the each lead 16 of the perimeter of the matrix 18, defined by rows 20a, 20b, 20c, and 20d are electrically connected to each other, and further connected to ground. This connection to ground may be made within the package 12, or within the traces of the printed circuit board (not shown). Preferably, the spacing set by forming an electrical ground about the perimeter of the matrix 18, creates a Faraday cage about the interior leads of the matrix 18.

As is known, the Faraday cage is a practical application the principal that when any other hollow conductor is given a charge on its inside, then the charge will spread all over the outside surface of the conductor in such a way as to produce no electric field inside (or an electric field of zero magnitude). As an example, the Van de Graaff generator uses this effect to produce such a large potential on the outside surface of its dome. Perhaps a more common example of the useful benefits of a Faraday cage is that of a passenger aircraft. The metal body of the aircraft forms a Faraday cage that protects the passengers on the interior from electric shock during thunderstorms, even though the outside of the aircraft may be struck by lightning.

To maximize the affect of the Faraday cage created by the at least one perimeter row of the matrix 18, adjacent leads (e.g., 32 and 34) are spaced so that the space separating the adjacent leads 32 and 34 is no greater than 1/20 the length of the wavelength of the highest frequency signal carried across any of the leads of the BGA package 12. In this regard, specially designed chips are frequently designed with certain signal expectations, such as clock signals or otherwise. From the frequency expectations, the wavelength can be readily determined, and therefore the spacing between the leads 16 can be set.

To further increase the effectiveness of the Faraday cage created by grounding the perimeter row of lead 16, additional perimeter rows, for example, 30a, 30b, 30c, and 30d may be grounded together as well. While the embodiment of FIG. 3 illustrates a six by six matrix 18 of leads, it will be appreciated that in many packages several hundred leads may be present, and therefore the outer two rows (or more) may be grounded together, with plenty of leads remaining for carrying circuit signals.

In yet another embodiment (not shown), greater spacing may be provided between the signal leads 16 disposed in the interior of the matrix 18 than between the adjacent lead 16 defining the perimeter row of the matrix 18. In this regard, a higher density of leads may define the perimeter 20a, 20b, 20c, and 20d of the leads to provide maxirum EMI shielding of and from the signals carried on the interior leads.

Figure 4:
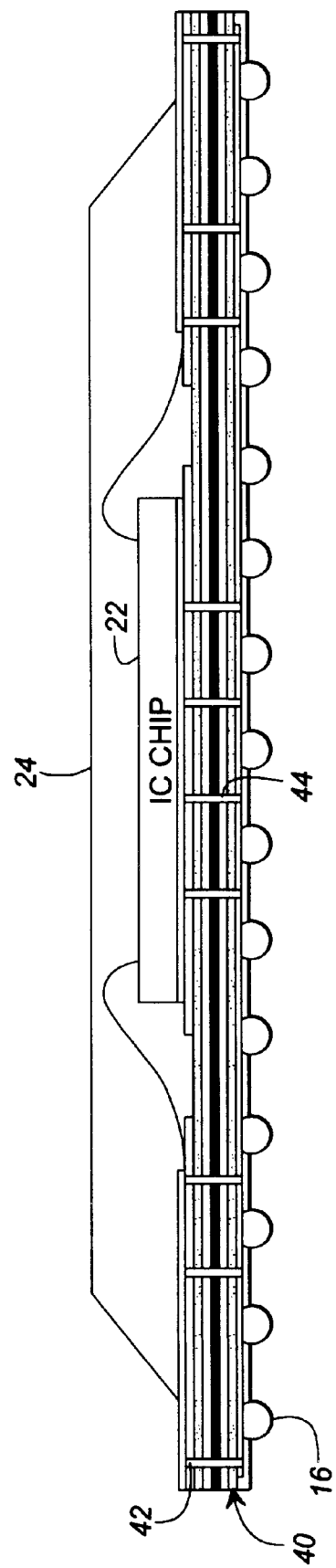
FIG. 4 is a cross-sectional side view of a second ball grid array package constructed in accordance with the present invention.

It will be appreciated that the concepts and teachings of the present invention may be applied to various types of integrated circuit packages. FIG. 4 illustrates just one of a number of alternative package types that may embodiment the present invention. In this regard, FIG. 4 illustrates a multilayer PCB 40 having interconnect vias 42 and thermal vias 44 extending therethrough. As was illustrated in FIG. 2, a die 22 forms the heart of the package, and is sealed by a mold compound 24. If plurality of leads 16 are disposed to form a matrix on the underside, for example, of the integrated circuit package.

Figure 5:
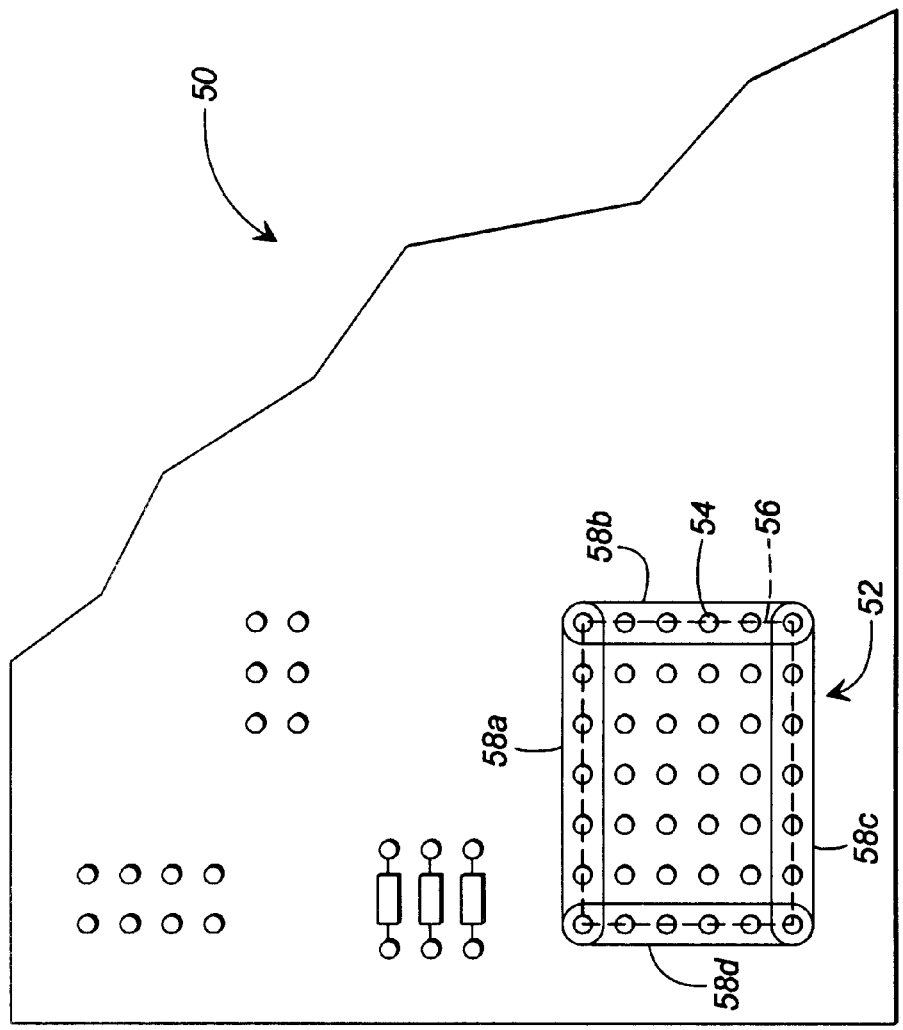
FIG. 5 is a top-view of a circuit board defining a socket area for receiving a ball grid array package, constructed in accordance with the present invention.

Finally, reference is made to FIG. 5, which illustrates an alternative embodiment of the present invention. In this regard, FIG. 5 is a top view of a socket area of a printed circuit board 50, disposed to receive a BGA package. Specifically, the socket area is defined by a matrix 52 of solder (or other conductive material) pads 54 disposed to receive and electrically couple the leads of a BGA package. As illustrated by dashed lines, a conductive path 56 interconnects each of the solder pads 54 defining the perimeter 58a, 58b, 58c, and 58d of the matrix 52, for further connection to ground (electrical). This conductive path 56 may be a trace provided on the surface of the circuit board 50. Alternatively, the conductive path may simply be a ground plane provided within the circuit board 50, assuming the circuit board is a multilevel circuit board assembly. Each of the perimeter solder pads may be connected (electrically) to the ground plane by vias (not shown). In this way, the perimeter of the matrix of leads of the integrated circuit package may be grounded (when the package is installed), to thus create a Faraday Cage about the interior leads, and thus enhance the EMI characteristics.

Figure 6:
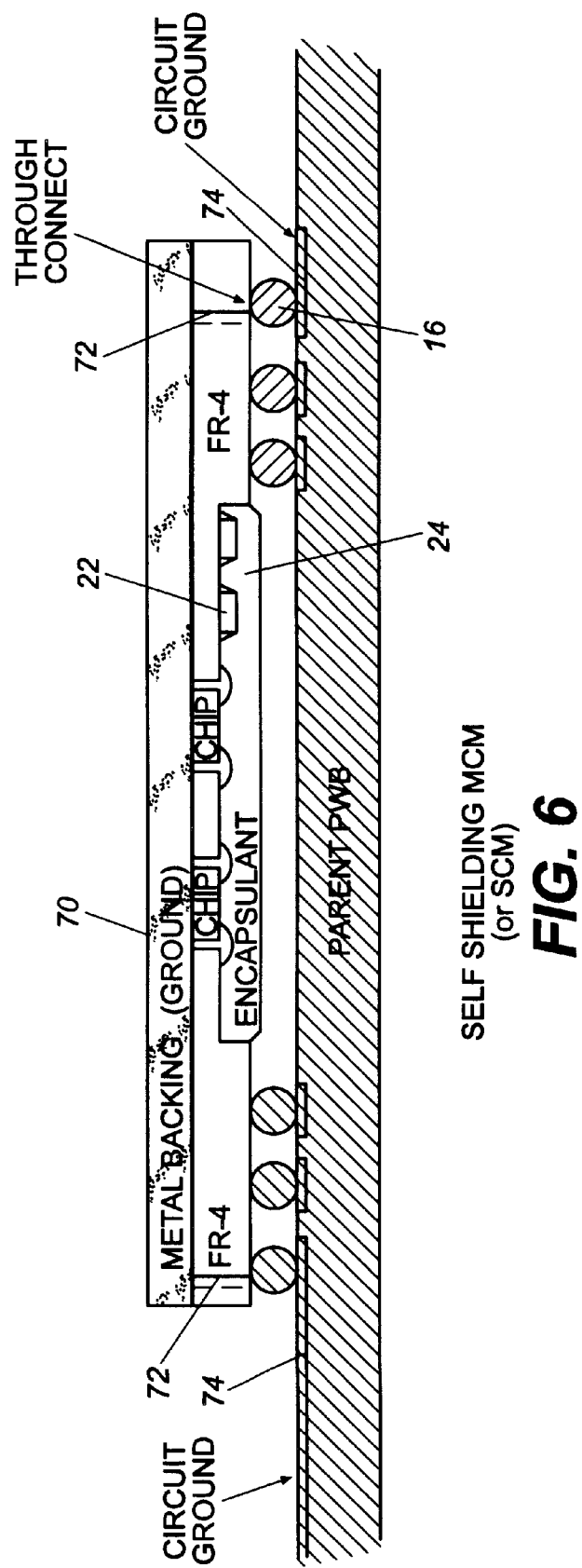
FIG. 6 a cross-sectional side view of an alternative embodiment of the present invention.

Reference is briefly made to FIG. 6, which shows yet a further embodiment of the present invention. Specifically, FIG. 6 illustrates a "face-down" configuration, whereby die elements 22 are disposed adjacent (face down) the printed wiring board. Significant to this embodiment, a metal backing 70 is layered across the package. This metal backing is connected via through connects 72 to at least one of the leads 16 of the perimeter of the matrix of leads. A ground trace 74 may be disposed to interconnect the remainder of the perimeter leads 16. Ultimately, whether connected via through connects 72 or otherwise, all of the perimeter leads should be electrically connected to the metal backing 70 and to ground.

Having described various preferred embodiments above, several additional points regarding the present invention are set out herein. First, is should be appreciated that the spacing between the leads 16 need not be uniform. So long as the grounded leads (forming the Faraday Cage or shielding layer) are spaced closely enough to perform the desired (e.g., frequency) shielding, their spacing need not be uniform. Likewise, the spacing among the remainder of the package signal leads need not be uniform (although it often will be).

Second, the preferred embodiment of the present invention has been described with a package having at least one perimeter row being grounded. It will be appreciated, however, that the grounded row(s) of leads need not extend all the way around the package. For example, if a given package is to be laid out near the edge of a circuit board, or otherwise such that it will not have a device disposed adjacent to one or more sides, those one or more sides need not have a grounded row of leads. Thus, a package constructed in accordance with the invention may have grounded rows of leads that cover fewer that all four sides of the package.

Similarly, the row(s) of the package that are grounded in accordance with the invention need not be the outermost row(s). Instead, certain signals may be "partitioned" by grounding one or more interior rows of the leads 16. Thus, signal leads disposed within the grounded partition will be shielded, while those outside the partition will not.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A circuit board apparatus comprising:
   a circuit board substrate having conductive elements;
   a socket area for receiving a semiconductor package defined by a matrix of socket pads, each socket pad comprising a metal coating and shaped to receive a lead of the semiconductor package; and
   at least one conductive element that electrically connects each of the socket pads that define a perimeter of the matrix of socket areas, for electrical connection to ground, wherein the socket areas that define the perimeter of the matrix are more closely spaced than socket pads within the interior of the matrix.

2. The circuit board apparatus as defined in claim 1, wherein the socket pads defining the perimeter of the matrix are uniformly spaced.

3. The circuit board apparatus as defined in claim 1, wherein the semiconductor package is a ball grid array package, defined by spherically-shaped leads.

4. The circuit board apparatus as defined in claim 1, further including a ground plane in the circuit board.

5. The circuit board apparatus as defined in claim 4, wherein the at least one conductive element connects each of the plurality of socket areas defining the perimeter to the ground plane.

6. The circuit board apparatus as defined in claim 1, wherein the perimeter is defined by all of the socket areas of the outermost rows and columns of the matrix.

7. The circuit board apparatus as defined in claim 1, wherein the perimeter is defined by all of the socket areas of the two outermost rows and two columns of the matrix.

8. The circuit board apparatus as defined in claim 1, wherein the perimeter is defined by all of the socket areas of the outermost rows and columns of the matrix.

9. The circuit board apparatus as defined in claim 1, wherein the perimeter is defined by all of the socket areas of at least one of the outermost rows and at least one of the outermost columns of the matrix.

10. A ball grid array package for attachment to a circuit board apparatus comprising:

a substrate having a semiconductor die defining an electronic circuit formed thereon;

a matrix of spherically-shaped package leads disposed adjacent the substrate and opposite the semiconductor die;

conductive elements electrically connecting circuit points on the semiconductor die to the package leads; and at least one conductive element that electrically interconnects the leads that define a perimeter of the matrix of package leads, for electrical connection to ground wherein the electrically connected leads that define the perimeter of the matrix are more closely spaced than leads within the interior of the matrix.

11. The ball grid array package as defined in claim 10, wherein the leads defining the perimeter of the matrix are uniformly spaced apart.

12. The ball grid array package as defined in claim 10, wherein the at least one conductive element interconnects all of the leads that define the perimeter of the matrix.

13. The ball grid array package as defined in claim 10, wherein the perimeter is defined by all of the leads of the outermost rows and columns of the matrix.

14. The ball grid array package as defined in claim 10, wherein the perimeter is defined by all of the leads of the two outermost rows and two columns of the matrix.

15. The ball grid array package as defined in claim 10, wherein the perimeter is defined by all of the leads of the outermost rows and columns of the matrix.

16. The ball grid array package as defined in claim 10, wherein the perimeter is defined by all of the leads of at least one of the outermost rows and at least one of the outermost columns of the matrix.

17. A circuit board apparatus comprising:

a circuit board substrate having conductive elements;

a socket area for receiving a semiconductor package defined by a matrix of socket pads, each socket pad comprising a metal coating and shaped to receive a lead of the semiconductor package; and at least one conductive element that electrically connects each of the socket pads that define at least one row of the matrix of socket areas, for electrical connection to ground, wherein the electrically connected socket pads that define the perimeter of the matrix are separated by a distance of no greater than $\frac{1}{20}$ the length of a wavelength of the highest frequency signal carried on any of the socket pads, wherein the socket areas that define the perimeter of the matrix are more closely spaced than socket pads within the interior of the matrix.

18. The circuit board apparatus as defined in claim 17, wherein the at least one conductive element is disposed to electrically connect each of the socket pads that define a plurality of rows of the matrix of socket areas.

19. The circuit board apparatus as defined in claim 17, wherein the at least one conductive element is disposed to electrically connect each of the socket pads that define a plurality of rows defining a closed area of the matrix of socket areas.

20. The circuit board apparatus as defined in claim 19, wherein the closed area is defined along the perimeter of the socket areas.

21. The circuit board apparatus as defined in claim 19, wherein the closed area is defined within an interior of the socket areas.

* * * * *